United States Patent [19]
Cheney et al.
[11] 3,914,855
[45] Oct. 28, 1974

[54] METHODS FOR MAKING MOS READ-ONLY MEMORIES

[75] Inventors: Glen Trenton Cheney, Allentown; John Richard Edwards, Upper Saucon Township, County of Lehigh, both of Pa.
[73] Assignee: Bell Telephone Laboratories, Incorporated, Murray Hill, N.J.

[22] Filed: May 9, 1974
[21] Appl. No.: 468,422

[52] U.S. Cl. ...................... 29/571; 29/577; 29/591; 29/580; 357/41; 357/45; 357/91
[51] Int. Cl.² ........................................... B01J 17/00
[58] Field of Search ............ 29/571, 577, 578, 580, 29/591, 577 IC; 357/41, 45, 91; 156/17

[56] References Cited
UNITED STATES PATENTS
3,377,513 4/1968 Ashby ............................ 29/577 IC
3,423,822 1/1969 Davidson ........................ 29/577 IC OTHER PUBLICATIONS
IBM Technical Disclosure Bulletin, Vol. 16, No. 6, Nov. 1973 pp. 1723–1725, Krick.

*Primary Examiner*—W. Tupman
*Attorney, Agent, or Firm*—R. B. Anderson

[57] ABSTRACT

An MOS read-only memory comprises a matrix array of IGFETs which are initially made all to be operable. The array is encoded by etching apertures in the gate electrodes of selected devices and ion implanting impurities through the apertures to render the selected devices inoperative, thus defining digital "O"s.

16 Claims, 6 Drawing Figures

METHODS FOR MAKING MOS READ-ONLY MEMORIES

BACKGROUND OF THE INVENTION

This invention relates to read-only memories, and more particularly, to MOS read-only memories.

The importance of integrated circuit technology derives largely from its simplicity and economy, and because of this, considerable work is being done in developing MOS (metal-oxide-semiconductor) integrated circuits. Such circuits use as the active device components unipolar transistors known as IGFETs (*insulated gate field effect transistor*) or MOS transistors. MOS circuits using IGFETs are now widely used in numerous digital systems, both for logic and memory applications, and are often favored over circuits using conventional bipolar transistors because of their ease of fabrication.

The active IGFET device is typically defined by separated source and drain regions on the surface of a wafer, with a channel region between them overlayed by a thin gate oxide layer and a gate electrode. As is well known, conduction between the source and drain regions, with resulting transistor action, is controlled by the overlying gate electrode. Because the diffusion steps for defining the source and drain regions, the oxidation steps, and the metalization, are all relatively simple and straightforward, these circuits are becoming increasingly favored, especially for digital circuits requiring considerable replication of components.

One class of digital circuit, the read-only memory, comprises a matrix array of storage elements each permanently encoded to store either a digital "1" or a "0". MOS read-only memories are well known and comprise an IGFET at each matrix crosspoint location, with each IGFET made to be conductive or non-conductive in response to coincident applied voltages, depending upon whether one wishes to define "1" or "0". As described, for example, in the book "MOSFET in Circuit Design" by Crawford, McGraw-Hill, 1967, pages 113–118, the conductive IGFET is made in the usual manner with a thin gate oxide overlying the channel region, while the nonconductive IGFETs, encoded typically to define a "0", comprise a thick oxide overlying the channel region. This structure is convenient because a thick oxide is used in MOS circuits to cover most of the wafer surface; it effectively isolates the gate electrode and prevents it from inducing conduction.

Since the primary virtue of MOS read-only memories is their simplicity and economy, any modifications which would further increase the ease with which they could be made and used would be of great advantage. In our use of such devices, we have observed that they must each be "tailor-made" for the specific use to which they are to be put; that is, before any circuit can be made, one must know how it is to be encoded to determine the locations at which the thin gate oxides are to be included or omitted. As a practical matter, specifically encoded read-only memories often involve relatively small production runs. If an all-purpose read-only memory could be made which could easily be reliably encoded, significant production economies could be realized.

SUMMARY OF THE INVENTION

In accordance with the invention, a read-only memory is made by forming a parallel array of source and drain regions on the surface of a semiconductor substrate, arranging thin gate oxide layers in rows perpendicular to the source and drain stripes, and forming a plurality of gate electrode stripes also perpendicular to the source and drain stripes and each overlying successive thin gate oxide layers. This structure in effect defines a matrix array of IGFETs in which the IGFET at each crosspoint is operable. The array is then encoded by etching apertures in the gate electrode stripes so as to expose the thin gate oxide layers at locations at which a "0" is to be defined. By using ion implant technology, impurity ions are projected through the exposed gate oxide layers so as to prevent surface inversion layer conduction in the underlying semiconductor.

To prevent conduction when voltages are applied, the projected ions preferably produce a conductivity type in the semiconductor which is opposite that of source and drain regions, with no diffusion or annealing after implant. The thick oxide and the metalization covering the unexposed regions of the array shield the remainder of the substrate from the ion implant. The major advantage of this construction is that MOS memory circuits can be mass-produced in uniform manner, stockpiled for future use, and thereafter encoded for the specific purpose intended.

These and other objects, features and advantages of the invention will be better understood from a consideration of the following detailed description taken in conjunction with the accompanying drawings.

DETAILED DESCRIPTION OF THE DRAWINGS

Figure 1:
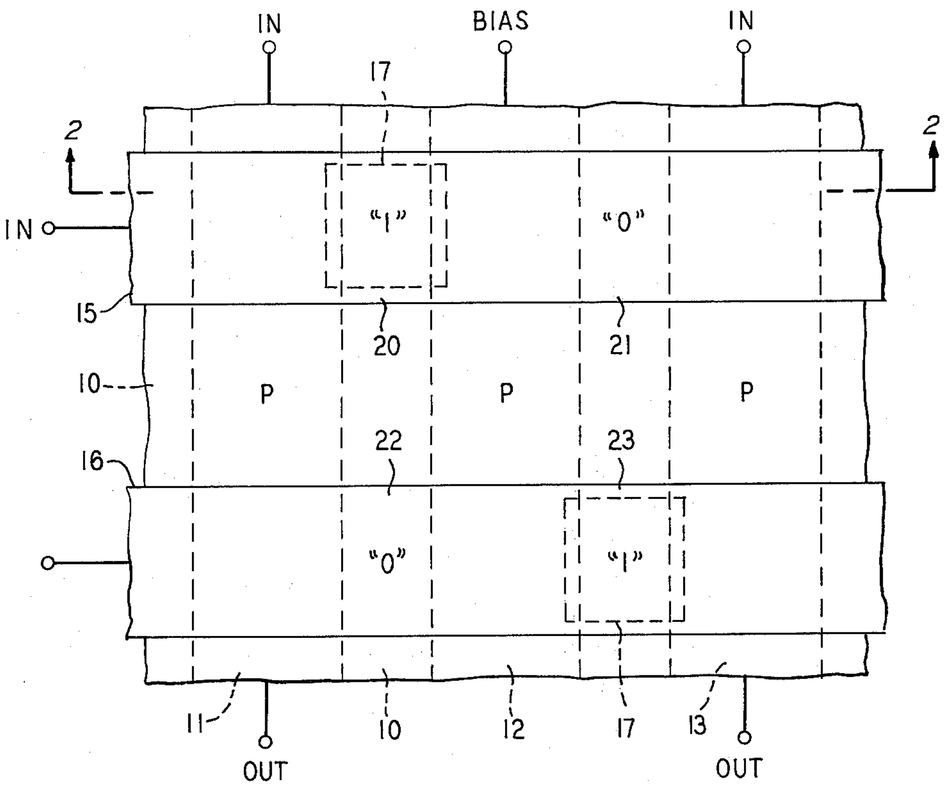
FIG. 1 PRIOR ART
FIG. 1 is a schematic representation of an MOS read-only memory of the prior art.
Figure 2:
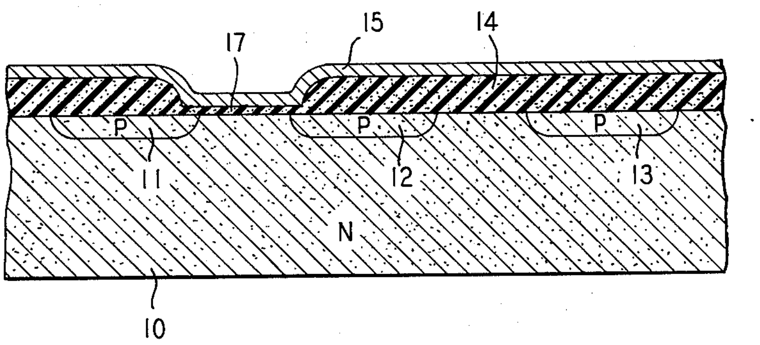
FIG. 2 PRIOR ART
FIG. 2 is a view taken along line 2—2 of FIG. 1.

Referring now to FIGS. 1 and 2 there is shown schematically a portion of an MOS read-only memory of the prior art comprising an n-type semiconductor wafer 10 including on one surface a plurality of p-type semiconductor stripes 11, 12 and 13. A thick oxide layer 14 covers a major portion of the wafer. Extending in a direction perpendicular to the semiconductor stripes are a plurality of gate electrode stripes 15 and 16. Located at certain locations between the semiconductor stripes are a plurality of thin oxide layers 17.

Consider the semiconductor stripe 12 to be a source region, the stripes 11 and 13 to be drain regions, and the n-type semiconductor surface between regions 11, 12 and 13 to be a potential channel region. Each location at which a gate electrode stripe traverses a channel region constitutes a potential IGFET for storing an information bit at a matrix crosspoint.

If one wishes at the crosspoint to store a digital "1", a thin gate oxide layer 17 is formed, which permits IGFET conduction, whereas, if a digital "0" is to be stored, the oxide layer is sufficiently thick to provide a high threshold voltage so that surface channel conduction due to normal gate electrode potentials is prevented. The thin gate oxide layers 17 are typically made by etching and reoxidation.

In the example shown, one may consider each drain region stripe, 11 and 13, as a matrix column, and each gate electrode stripe as a matrix row. With *n* gate electrodes and *m* drain stripes, there are $n \times m$ crosspoints, and an equal number of potential IGFETS. FIG. 1 shows two rows and two columns with 4 IGFET locations 20, 21, 22 and 23 being formed. Assuming that it is desired to encode the memory such that locations 20 and 23 store "1"s and locations 21 and 22 store "0"s, then thin gate oxide layers 17 are included at locations 20 and 23 but not at 21 and 22 as shown. With an appropriate bias on source region 12, concurrent input voltages on the gate and drain stripes are sufficient to cause conduction if a "1" has been stored. Thus, input voltages on drain stripe 11 and gate electrode stripe 15 give a large output voltage from drain stripe 11 because at location 20 there is IGFET conduction due to the stored "1". An input voltage at drain stripe 13 does not give a correspondingly high output voltage in response to a gate voltage on gate stripe 15 because at location 21 a "0" has been stored.

From the foregoing, it is apparent that the prior art read-only memory must be encoded at the time that the photolithographic step defines the thin gate dielectric regions. In accordance with the present invention, the read-only memory shown in FIGS. 3–6 can be substantially completely fabricated, stored until use is required, and then conveniently encoded for the purpose intended.

Figure 3:
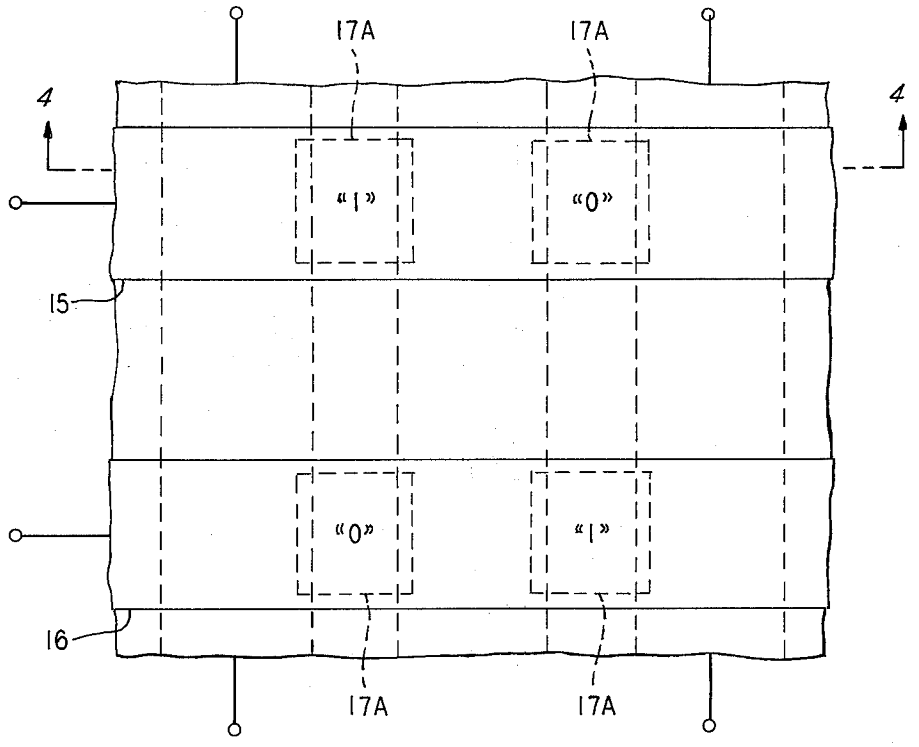
FIG. 3 is a schematic view of a partially constructed MOS read-only memory in accordance with an illustrative embodiment of the invention.
Figure 4:
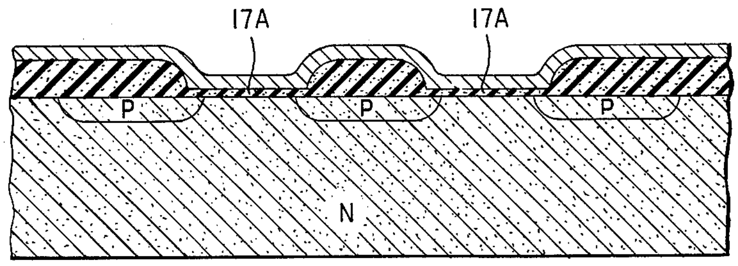
FIG. 4 is a view taken along lines 4—4 of FIG. 3.

Referring to FIGS. 3 and 4, the read-only memory matrix array is first fabricated in substantially the same way as that of FIGS. 1 and 2 except that potentially operable IGFETS are defined at all of the crosspoints. That is, thin gate oxide layers 17A are formed at all the IGFET locations and metalized regardless of whether it is eventually intended to store a "1" or a "0". After this substantially complete fabrication, the devices may be stored until a specific use is ascertained.

Figure 5:
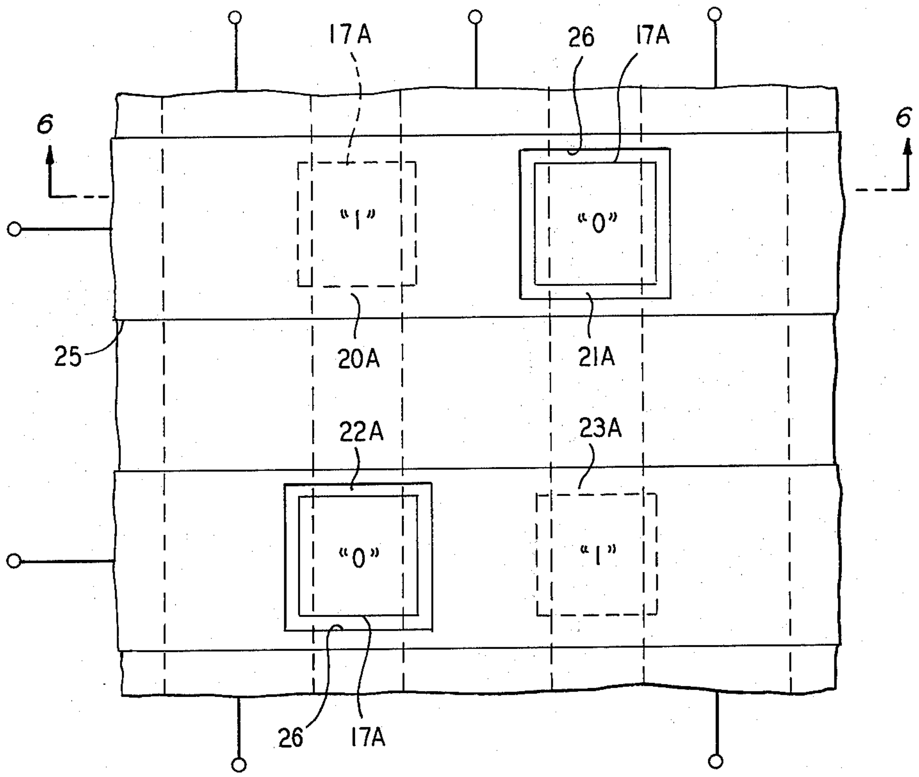
FIG. 5 is a view of the circuit of FIG. 3 after encoding.
Figure 6:
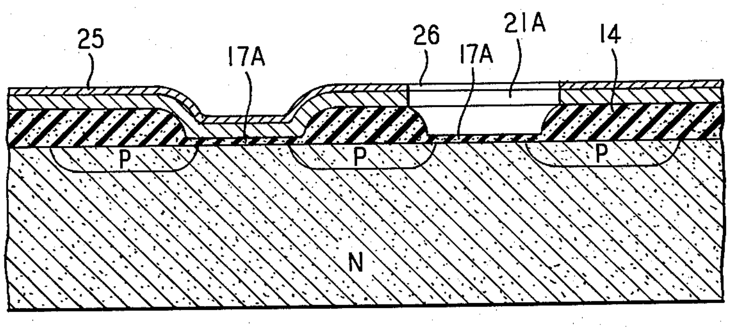
FIG. 6 is a view taken along lines 6—6 of FIG. 5.

Referring to FIGS. 5 and 6, and particularly FIG. 6, the matrix array is encoded by first covering it with a layer of photoresist 25. Next, a mask is formed with apertures at locations corresponding to the encoding of digital "0"s. In accordance with conventional photolithographic exposure and etching techniques, the mask is registered with the array, the photoresist exposed and developed and the gate electrode is etched at locations 21A and 22A corresponding to the locations of digital "0"s. The etching of the gate electrode defines apertures 26 in the gate electrode which do not sever the electrode but which completely expose the underlying gate oxide layers 17A.

Next, the entire upper surface of the array is implanted with n-type impurity ions to prevent surface channel conduction between the adjacent source and drain regions and therefore to prevent IGFET operation at the "0" location when the gate and drain electrodes are energized. Of course it is not necessary that the implanted channel region be rendered completely non-conductive; it is important only that the threshold of surface channel conduction be raised to a value above the voltage applied by the adjacent gate electrode. During implantation, the photoresist 25, the gate electrode stripes and the thick oxide 14 mask the remaining upper surface of the semiconductor wafer substrate from the irradiated ions.

It has been determined that, when using a shallow phosphorous ion implant into n-Si substrates, the ion implant increases the threshold voltage of conduction by an amount $\Delta V_T$ given approximately by the equation $$\Delta V_T = -\frac{DqT}{\epsilon}$$

where D is the effective ion dose implanted in ions/sq. cm, $q$ is the charge on an electron, $\epsilon$ is the dielectric constant of Si, T is the oxide thickness and $\Delta V_T$ is the increase in threshold voltage. It has been further found that with a gate dielectric thickness of 1,500 Angstroms and an applied ion dose of $10^{14}$ ions/sq. cm. at an energy of 50 Kev, $\Delta V_T$ was −22 volts, which is a substantially greater threshold voltage increase than that required to prevent any transistor conduction due to normally applied gate and drain voltages in low threshold voltage MOS technology.

Ion implant machines and techniques for making them are sufficiently well known in the art that an explanation of their construction and use is not required. The energy levels used should be great enough to penetrate the thin gate oxide, which is typically silicon dioxide having a thickness of about 1,500 Angstroms, but should not be so great that the major effect of the ions is at a depth of 2 microns or more into the silicon substrate. With these considerations, the energy level should practically be in the range of 30 Kev to about 500 Kev. The ion dose should, of course, satisfy the foregoing equation and should in any case be in the range of about $10^{12}$ to $10^{15}$ ions/sq. cm.

Many experiments using various dosages and energy levels have been conducted, and from these it appears that the damage to the silicon surface due to the ion implant may be a major cause of the increased threshold voltage. From this it appears that radiation other than impurity ions could be used, as, for example, an electron beam, proton beam or high energy plasma. We have also found that the device should not be heated above 600°C after ion implant. Such heating has the effect of diffusing the implanted impurities, as well as other impurities in the device, and annealing the silicon surface, which has the effect of repairing crystal damage. If the photoresist coating is sufficiently thick, it can independently mask the device from the implanted ions; a photoresist mask of 5,000 Angstroms thickness has been found to give dependable masking for a 50 Kev implant, while a 10,000 Angstroms thickness will provide masking to a 150 Kev implant.

The MOS arrays that have been made use standard silicon beam-lead technology. Both the thick oxide layer and the gate dielectric are a dual layer of aluminum oxide ($Al_2O_3$) and silicon dioxide ($SiO_2$) with the metal layers being covered by a metalization of titanium, palladium, and gold. The titanium, palladium, and gold layers are typically made by evaporation and gold plating to respective thicknesses of approximately 1,000 Angstroms, 2,500 Angstroms, and 2 micrometers. Various other device parameters, processing materials and techniques, etchant constituencies, and the like, are sufficiently well known in the art as not to require further elaboration.

From the foregoing, it is clear that dependable MOS read-only memories have been described which are susceptible to low-cost mass production techniques, and which can be easily encoded by relatively straightforward mask and etch techniques. The particular process described should, however, be considered to be merely illustrative of the inventive concept. Various other embodiments and modifications may be made by those skilled in the art without departing from the spirit and scope of the invention.

We claim:

1. A method for making a read-only memory comprising the steps of:

forming a matrix array of operable IGFETs comprising the steps of forming an array of source and drain regions on a surface of a semiconductor substrate;

forming thin gate oxide layers overlying channel regions between adjacent source and drain regions;

forming a thick insulating layer over a major part of the remaining surface;

forming parallel gate electrodes each perpendicular to the array of source and drain regions and each overlying the thick insulative layer and successive gate oxide layers;

and encoding the array by rendering selected IGFETs inoperable;

the foregoing step comprising the step of removing that portion of the gate electrode immediately overlying the thin gate oxide layer of the selected IGFET without severing the entire width of the gate electrode.

2. The method of claim 1 wherein:

the removing step comprises the step of masking all but selected portions of the gate electrodes and etching the selected portions.

3. The method of claim 2 wherein:

the gate electrode forming step comprises the step of forming gate electrodes each having a larger width than those of the thin gate oxide layers it overlies; and the removing step comprises the step of etching apertures in the gate electrodes each having a width wider than that of the corresponding gate oxide layer and narrower than the gate electrode, thereby forming two parallel bridge conductors each bypassing gate electrode current past each selected inoperable IGFET.

4. The method of claim 2 further comprising the step of:

irradiating the matrix array with ions of sufficient energy to penetrate the exposed thin gate oxide regions to the semiconductor substrate but of insufficient energy to penetrate either the gate electrodes or the thick oxide.

5. The method of claim 4 wherein:

the ions are of a conductivity type which would discourage surface channel conduction between adjacent source and drain regions in response to an operating gate voltage.

6. The method of claim 5 wherein:

the ions are of a conductivity type opposite that of the source and drain regions.

7. The method of claim 6 wherein:

the mask step comprises the step of coating the matrix array with a photoresist that is sensitive to light, resistant to the etchant used in the etch step, and substantially non-permeable with respect to the projected ions, whereby the mask prevents penetration of the ions except at the selected thin gate oxide regions.

8. The method of claim 7 wherein:

the photoresist is at least 5,000 Angstroms thick.

9. The method of claim 6 wherein:

the substrate is silicon, the ions are projected at an energy of 30 to 500 Kev, and the ion dose is $10^{12}$ to $10^{15}$ ions/sq. cm.

10. The method of claim 9 wherein:

after the ion implant, the matrix array is maintained at a temperature below about 600°C, whereby there is no diffusion of the implanted ions or annealing of the implanted substrate.

11. A method for making a read-only memory comprising the steps of:

forming a plurality of semiconductor regions of one conductivity type on the upper surface of a wafer portion of the opposite conductivity type;

forming a plurality of thin gate oxide layers over the wafer portion between adjacent semiconductor regions;

forming a thick oxide layer over substantially the entire remaining surface of the wafer portion;

forming over each of the thin gate oxide layers a gate electrode;

encoding the array comprising the steps of coating the array with photoresist, forming a mask having an aperture at locations corresponding to specific binary digits, photolithographically exposing and etching the photoresist at locations corresponding to aperture locations, and etching apertures in the gate electrodes at locations corresponding to the specific binary digits, each gate electrode aperture substantially completely exposing an underlying thin gate layer;

and irradiating the array with subatomic particles of a type that discourages conduction between adjacent semiconductor regions, the irradiation being of a sufficient energy level to penetrate the exposed, thin gate oxide layers.

12. The method of claim 11 wherein:

the subatomic particles are ions of a conductivity type opposite that of the source and drain regions.

13. The method of claim 11 wherein:

the subatomic particles are ions of a conductivity type opposite that of the semiconductor regions;

the substrate is silicon;

the ions are projected at an energy of 30 to 500 Kev;

and the ion dose is $10^{12}$ to $10^{15}$ ions/sq. cm.

14. The method of claim 13 wherein:

the substrate is silicon, the ions are projected at an energy of 30 to 500 Kev, and the ion dose is $10^{12}$ to $10^{15}$ ions/sq. cm.

15. A method for making a read-only memory comprising the steps of:

forming a parallel array of semiconductor stripes of one conductivity type on the upper surface of a wafer of the opposite conductivity type;

forming a plurality of thin gate oxide layers over the wafer between adjacent semiconductor stripes, the gate oxide layers being arranged in rows perpendicular to the semiconductor stripes;

forming a thick oxide layer over substantially the entire remaining upper surface of the wafer;

forming a plurality of parallel gate electrode stripes each perpendicular to the semiconductor stripes and each overlying successive thin gate oxide layers;

encoding the array comprising the steps of coating the array with photoresist, forming a mask having an aperture at locations corresponding to digital "0"s, photolithographically exposing and etching the photoresist at locations corresponding to the aperture locations, and etching apertures in the gate electrode stripes at locations corresponding to digital "0"s, each gate electrode aperture substantially completely exposing an underlying thin gate oxide layer without severing the gate electrode; and irradiating the array with subatomic particles of a type that discourages conduction between adjacent source and drain regions, the irradiation being of a sufficient energy level to penetrate the exposed thin gate oxide layers.

16. The method of claim 15 wherein:

after the ion implant, the array is maintained at a temperature below about 600°C, whereby there is no diffusion of the implanted ions or annealing of the implanted substrates.

* * * * *

UNITED STATES PATENT AND TRADEMARK OFFICE
CERTIFICATE OF CORRECTION

PATENT NO. : 3,914,855
DATED : October 28, 1975
INVENTOR(S) : Glen T. Cheney and John R. Edwards It is certified that error appears in the above-identified patent and that said Letters Patent are hereby corrected as shown below:

On the Abstract page of the patent, the issue date "Oct. 28, 1974" should be --Oct. 28, 1975--.

Signed and Sealed this

*thirtieth* Day of *March 1976*

[SEAL]

*Attest:*

RUTH C. MASON
*Attesting Officer*

C. MARSHALL DANN
*Commissioner of Patents and Trademarks*